United States Patent
Karabed et al.

(10) Patent No.: US 8,724,243 B1
(45) Date of Patent: May 13, 2014

(54) SYSTEMS AND METHODS FOR RUN LENGTH LIMITED ENCODING

(71) Applicant: LSI Corporation, Milpitas, CA (US)

(72) Inventors: Razmik Karabed, San Jose, CA (US); Shaohua Yang, Santa Clara, CA (US); Wu Chang, Santa Clara, CA (US); Victor A. Krachkovsky, Alentown, PA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/707,898

(22) Filed: Dec. 7, 2012

(51) Int. Cl.
*G11B 20/14* (2006.01)
*H03M 7/00* (2006.01)

(52) U.S. Cl.
USPC .............................. 360/40; 341/95

(58) Field of Classification Search
None
See application file for complete search history.

(56) References Cited

U.S. PATENT DOCUMENTS

| | | |
|---|---|---|
| 6,029,264 A | 2/2000 | Kobayashi |
| 2007/0201632 A1 | 8/2007 | Ionescu |
| 2010/0042890 A1 | 2/2010 | Gunnam et al. |
| 2012/0005551 A1 | 1/2012 | Gunnam et al. |

OTHER PUBLICATIONS

Kang et al., "A Two-Stage Iterative Decoding of LDPC Codes for Lowering Error Floors", IEEE GLOBECOM Proceedings, 1088-1091 (2008).
Lin et al "An efficient VLSI Architecture for non binary LDPC decoders"—IEEE Transaction on Circuits and Systems II vol. 57, Issue 1 (Jan. 2010) pp. 51-55.
Perisa et al "Frequency Offset Estimation Based on Phase Offsets Between Sample Correlations" Dept. of Info. Tech. University of Ulm 2005.
U.S. Appl. No. 13/452,733, Unpublished (filed Apr. 20, 2012) (Shaohua Yang).
U.S. Appl. No. 13/654,417, Unpublished (filed Oct. 18, 2012) (Fan Zhang).
U.S. Appl. No. 13/426,722, Unpublished (filed Mar. 22, 2012) (Fan Zhang).
U.S. Appl. No. 13/450,289, Unpublished (filed Apr. 18, 2012) (Shaohua Yang).
U.S. Appl. No. 13/363,751, Unpublished (filed Feb. 1, 2012) (Lei Chen).
U.S. Appl. No. 13/284,754, Unpublished (filed Oct. 28, 2011) (Fan Zhang).

*Primary Examiner* — Paul Huber
(74) *Attorney, Agent, or Firm* — Hamilton DeSanctis & Cha (LSI)

(57) ABSTRACT

Systems and methods relating generally to processing information, and more particularly without limitation to systems and methods for encoding data sets.

20 Claims, 7 Drawing Sheets

SYSTEMS AND METHODS FOR RUN LENGTH LIMITED ENCODING

BACKGROUND

The present invention relates generally to processing information, and more particularly without limitation to systems and methods for encoding data sets.

Typical data processing involves receiving a data stream and processing the data stream to recover the originally provided data. In such systems, data is generally encoded prior to transmission and decoded upon reception. The encoding may include modulation where long runs of '1s' or '0s' that potentially undermine one or more elements of the data transfer and decoding processes are prevented. However, as codewords continue to increase in length, traditional approaches to limiting run length become impractical or even impossible.

Hence, for at least the aforementioned reasons, there exists a need in the art for advanced systems and methods for data processing.

BRIEF SUMMARY

The present invention relates generally to processing information, and more particularly without limitation to systems and methods for encoding data sets.

Various embodiments of the present invention provide data processing systems that include a data modulation circuit. The data modulation circuit is operable to: receive a data input; apply a first run length limiting algorithm to the data input to yield a first interim run length limited output of a block length N and a second interim run length limited output of a block length N; and apply a second run length limiting algorithm to the first interim run length limited output to yield a modulated output. The combination of the first interim run length limited output and the second run length limited output exhibits at least one transition from a first level to a second level. The modulated output exhibits at least one transition between the first level and the second level.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Figure 1:
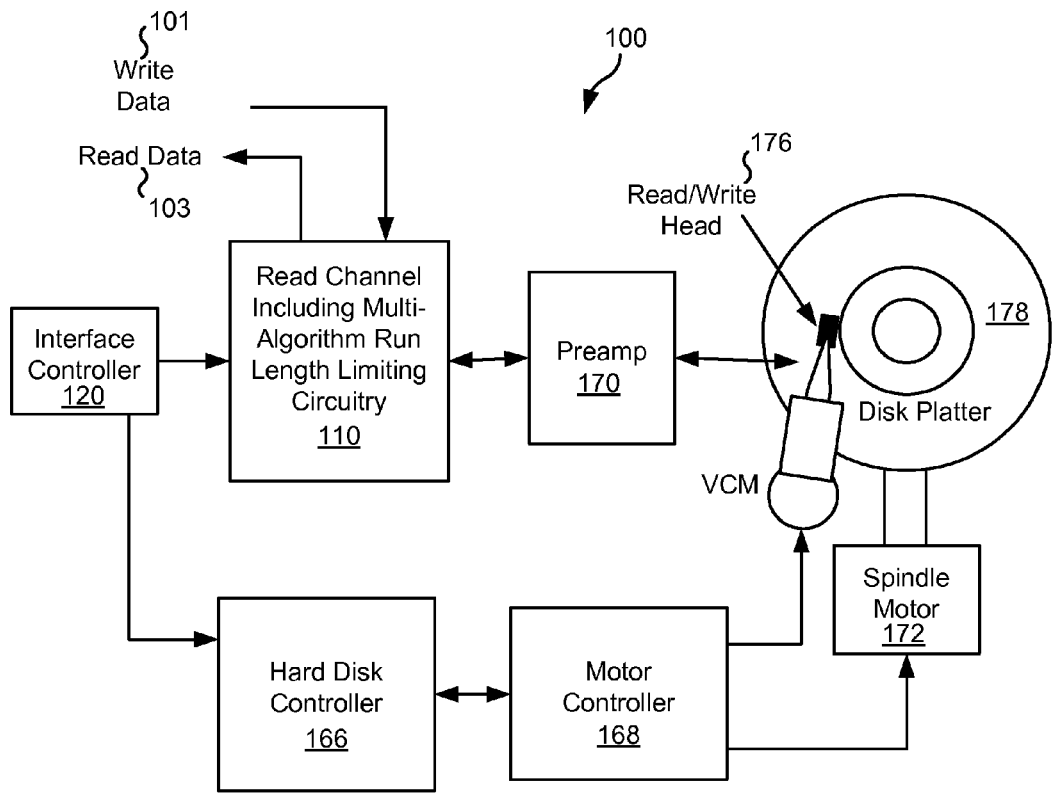
FIG. 1 shows a storage device including multi-algorithm run length limiting circuitry in accordance with different embodiments of the present invention.

The present invention relates generally to processing information, and more particularly without limitation to systems and methods for encoding data sets.

Various embodiments of the present invention provide data processing systems that include a data modulation circuit. The data modulation circuit is operable to: receive a data input; apply a first run length limiting algorithm to the data input to yield a first interim run length limited output of a block length N and a second interim run length limited output of a block length N; and apply a second run length limiting algorithm to the first interim run length limited output to yield a modulated output. The combination of the first interim run length limited output and the second run length limited output exhibits at least one transition from a first level to a second level. The modulated output exhibits at least one transition between the first level and the second level.

In some instances of the aforementioned embodiments, the first run length limiting algorithm operates to assure a transition at the last bit in the second interim run length limited output from the first level to the second level where at least a defined number of preceding bits in the data input are at the first level. In some such instances, the defined number is less than N. In one particular instance, the defined number is less than one half of N. In one or more instances of the aforementioned embodiments, the maximum number of consecutive non-transitioning states across the combination of the first interim run length limited output and the second interim run length limited output is (2N−1). In particular cases, the second run length limiting algorithm is an encoding algorithm that replaces each pattern in the first interim run length limited output corresponding to one of a set of first defined data patterns with a corresponding pattern from a set of second defined data patterns, where every pattern in the set of second defined patterns includes at least one transition between the first level and the second level. A transition from the first level to the second level may be, but is not necessarily limited to, a transition from a logic '1' to a logic '0', or a transition from a logic '0' to a logic '1'.

In various instances of the aforementioned embodiments, the data processing system further includes a low density parity check encoder circuit operable to encode the modulated output to yield a codeword. In some such instances, the data processing system further includes a data processing circuit that is operable to: apply a first decoding algorithm to reverse the encoding by the low density parity check encoder circuit; and apply a second decoding algorithm to reverse the encoding applied by the data modulation circuit. In one particular case, the data processing circuit includes: a low density parity check decoder circuit; and a data detection circuit. The data detection circuit may be, but is not limited to, a maximum a posteriori data detector circuit, or a Viterbi algorithm data detector circuit.

Other embodiments of the present invention provide methods for data processing. The methods include: receiving a data input; applying a first run length limiting algorithm to the data input to yield a first interim run length limited output of a block length N and a second interim run length limited output of a block length N, where the combination of the first interim run length limited output and the second run length limited output exhibits at least one transition from a first level to a second level; and applying a second run length limiting algorithm to the first interim run length limited output to yield a modulated output, where the modulated output exhibits at least one transition between the first level and the second level.

Turning to FIG. 1, a storage device 100 including multi-algorithm run length limiting circuitry included as part of a read channel circuit 110 is shown in accordance with different embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178, and interacts with a host controller (not shown). The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This write data is then encoded and written to disk platter 178. The data encoding includes applying a run length limit to the received data such that long runs of '0s' and/or '1s' are precluded.

As part of transferring data to disk platter 178 during a write operation, write data 101 is received by read channel circuit and two or more run length limiting algorithms are applied thereto to yield a modulated output. A low density parity check encoding is applied to the modulated output to yield a codeword, and the codeword is written to the disk platter via preamplifier 170 and read/write head 176. The reverse process is performed during a read process to recover the originally written data. In some cases, the read channel circuit may include circuitry similar to that discussed in relation to FIG. 6, and/or may operate similar to the methods discussed below in relation to FIG. 7.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platted 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
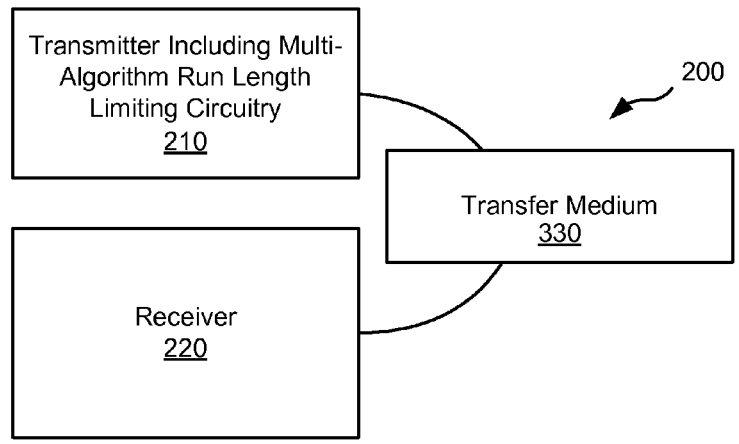
FIG. 2 depicts a communication system including multi-algorithm run length limiting circuitry in accordance with different embodiments of the present invention.

Turning to FIG. 2, a data transmission system 200 including a receiver 220 having multi-algorithm run length limiting circuitry is shown in accordance with various embodiments of the present invention. Data transmission system 200 includes a transmitter 210 that is operable to transmit encoded information via a transfer medium 230 as is known in the art. The encoded data is user data that has first been run length limited to yield a modulated output with a limited number of consecutive '0s' and/or '1s', and the modulated output is further encoded to include one or more error correction bits to yield the encoded data. The encoded data is received from transfer medium 230 by a receiver 220. Receiver 220 reverses the encoding and the run length limiting to yield the originally transmitted data.

As part of transferring data to receiver 220 via transfer medium 230, data to be transmitted is received by read channel circuit and two or more run length limiting algorithms are applied thereto to yield a modulated output. A low density parity check encoding is applied to the modulated output to yield a codeword, and the codeword is transferred to receiver 220 via transfer medium 230. The reverse process is performed by receiver 220 to recover the originally written data. In some cases, transmitter 210 may include circuitry similar to that discussed in relation to FIG. 6, and/or may operate similar to the methods discussed below in relation to FIG. 7.

Figure 3:
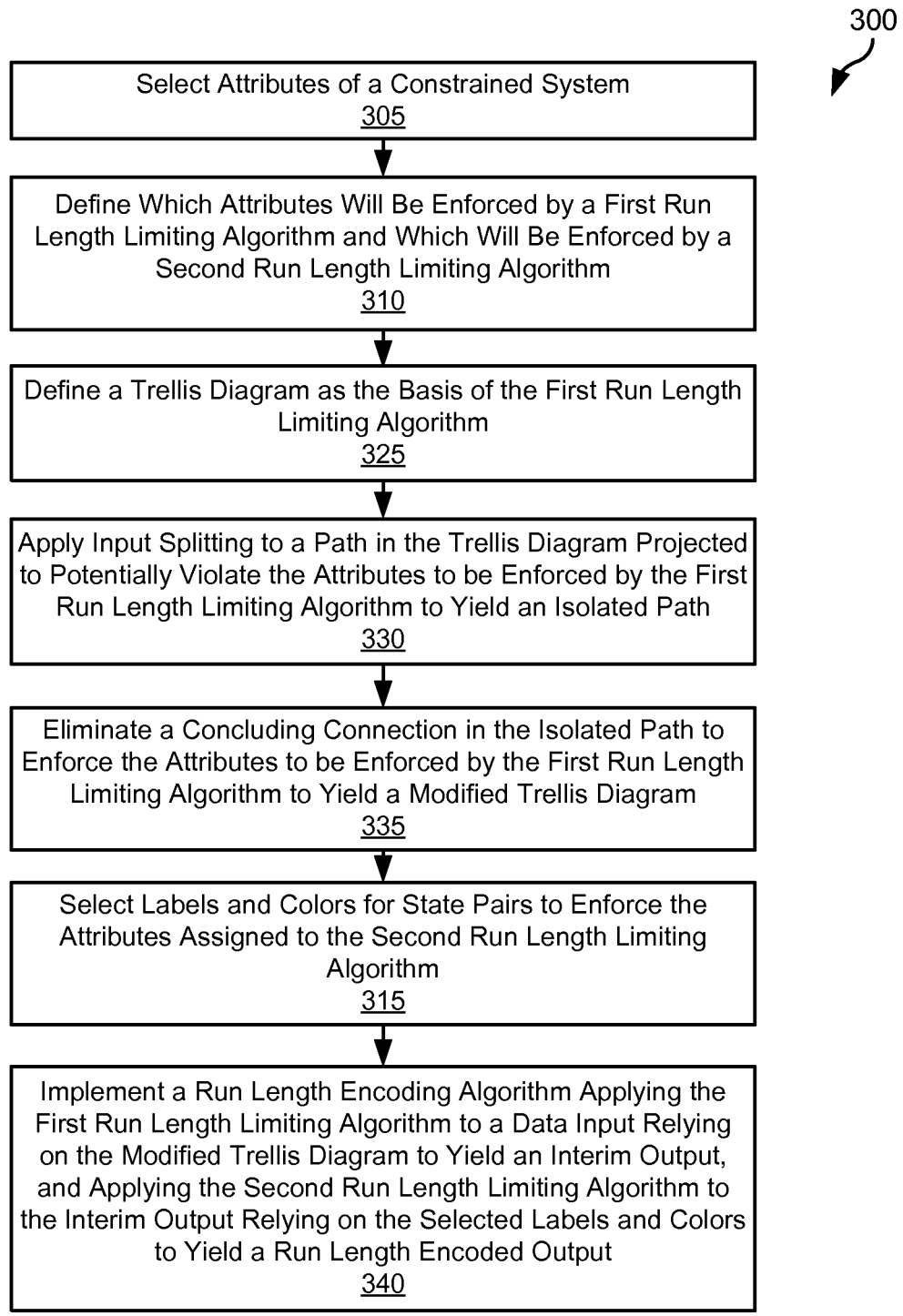
FIG. 3 is a flow diagram showing a design approach for implementing multi-algorithm run length limiting circuitry in accordance with one or more embodiments of the present invention.

Turning to FIG. 3, a flow diagram 300 shows a design approach for implementing multi-algorithm run length limiting circuitry in accordance with one or more embodiments of the present invention. Following flow diagram 300, attributes of a constrained system are selected (block 305). These attributes include, but are not limited to, a number of received user bits that are to be incorporated into a given codeword, and a maximum number of consecutive '0s' and/or '1s' that are allowed in the codeword. As just one example, the number of received user bits to be incorporated in a given codeword is seventeen (17) and the total number of bits after modulation is eighteen (18) (i.e., a 17/18 modulated code). As another example, the number of received user bits to be incorporated in a given codeword is thirty-four (34) and the total number of bits after modulation is thirty-six (36) (i.e., a 34/36 modulated code). Where an initial 17/18 code has '1' at the beginning and a subsequent 17/18 code has a '1' at the end and all other bits are '0s', a total run length of thirty-four (34) '0s' is possible. Thus, to assure a maximum run length of thirty-four (34), at least one transition must occur per codeword. Using the other example, where an initial 34/36 code has '1' at the beginning and a subsequent 34/36 code has a '1' at the end and all other bits are '0s', a total run length of seventy (70) '0s' is possible. Thus, to assure a maximum run length of seventy (70), at least one transition must occur per codeword. Based upon the disclosure provided herein, one of ordinary skill in the art will recognize a variety of constraints that may be selected in accordance with different embodiments of the present invention.

Figure 5A:
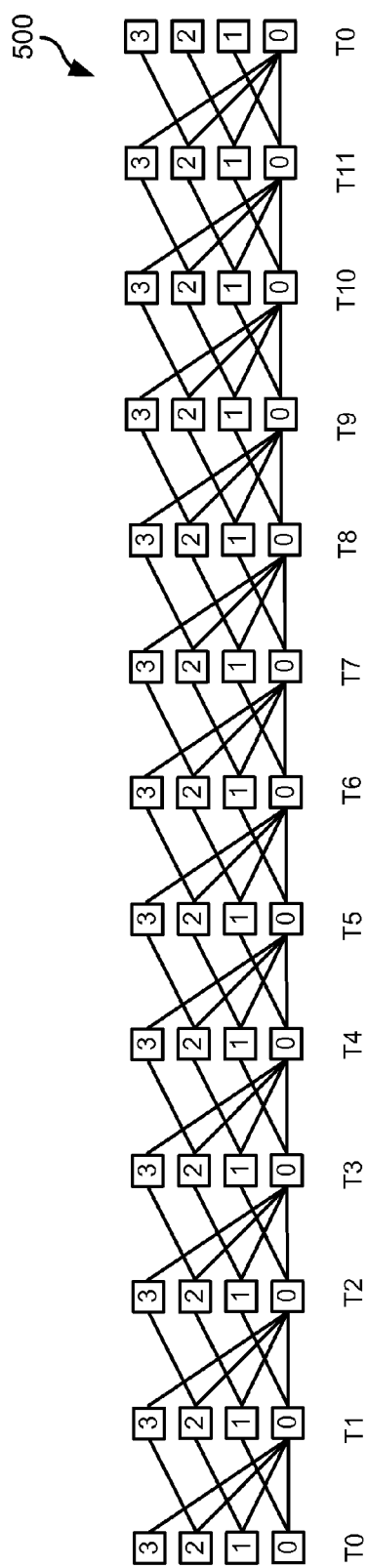
FIGS. 5$a$-5$c$ shows a trellis diagram including an isolated path that may be used in relation to various embodiments of the present invention for implementing another run length limiting circuit of the multi-algorithm run length limiting circuitry.

In addition, it is defined which attributes will be enforced by a first run length limiting algorithm and which will be enforced by a second run length limiting algorithm (block 310). It may be decided, for example, that the first run length limiting algorithm is to be applied first to yield a first result, and the second run length limiting algorithm will be applied to the first result to yield a second result. As an example, FIG. 5a shows a repeating twelve bit trellis diagram 500 (i.e., transitioning from time instances T0-T11) representing a modulation process including application of both the first run length limiting algorithm and the second run length limiting algorithm. It should be noted that the length of example of FIG. 5a is chosen for explanation purposes, and that embodiments of the present invention may be applied to data sets of much greater length. In the embodiment represented by trellis diagram 500, the first run length limiting algorithm is applied all bits (T0-T11) to yield a first output, and the second run length limiting algorithm is applied to the first output to yield a final result.

Figure 5B:
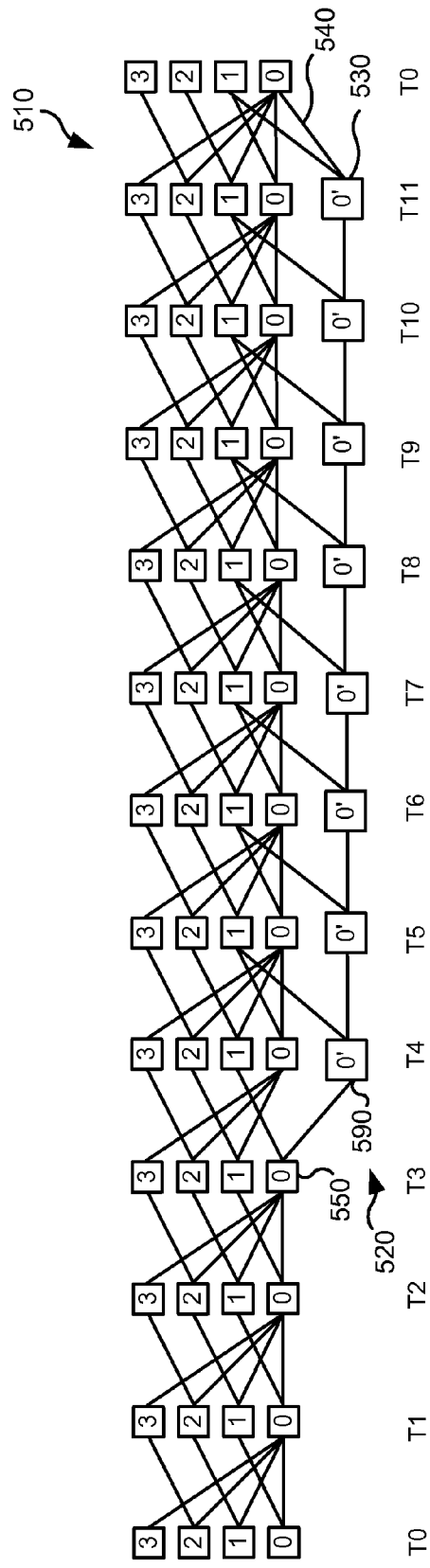

A trellis diagram is defined as the basis of the first run length limiting algorithm (block 325). As an example, FIG. 5a shows a repeating twelve bit trellis diagram 500 (i.e., transitioning from time instances T0-T11) representing a modulation process including application of both the first run length limiting algorithm and the second run length limiting algorithm. The transitions represented by time instances T0-T11 are implemented using an isolated path approach. The isolated path approach includes applying input splitting to a path in the trellis diagram projected to potentially violate the attributes to be enforced by the second run length limiting algorithm to yield the isolated path (block 330). Referring to FIG. 5b and following the previous example described in relation to FIG. 5a, a trellis diagram 510 is trellis diagram 500 modified to include an isolated path 520. In particular, the '0' state 550 corresponding to time instance T3 is split to lead to a '0" state 590 corresponding to time instance T4 in place of the transition to the '0' state of time instance T4. The input spitting may be done using any input splitting technique known in the art. Following trellis diagram 510, the only way to enter isolated path 520 is for an input to be '0' at state 550, and the only way to remain in isolated path 520 is to continue receiving '0s' as inputs from time instance T4 to time instance T11. At any point along isolated path an input '1' is received, a transition out of isolated path 520 occurs.

Figure 5C:
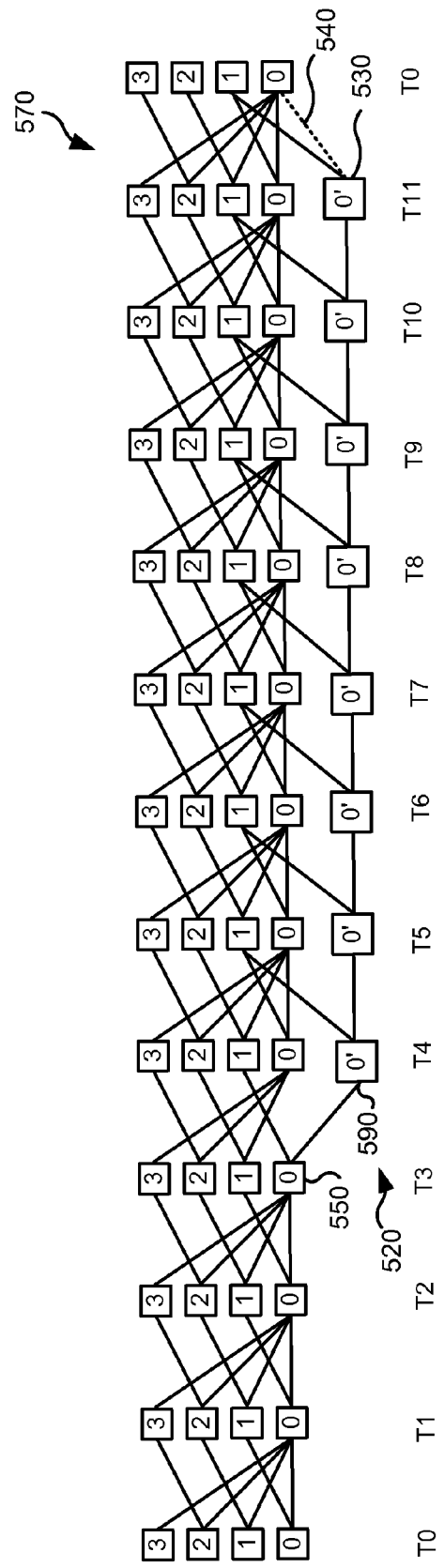

A concluding path transitioning from the isolated path to a standard path is eliminated (block 335). This is done to enforce the attributes defined in blocks 305, 310. For example, where the defined attributes allow for a maximum run length of X number of '0s', the concluding path transitioning from the isolated path to the standard path occurs at time instance TX. Turning to FIG. 5c, a modified trellis diagram 570 is shown that eliminates a concluding path 540 (the elimination noted by a dashed line). By eliminating the concluding path (block 335), the modified path does not allow a run of '0s' to have a length greater than the defined X (in this case, X is two times the length of the trellis less one).

Figure 4:
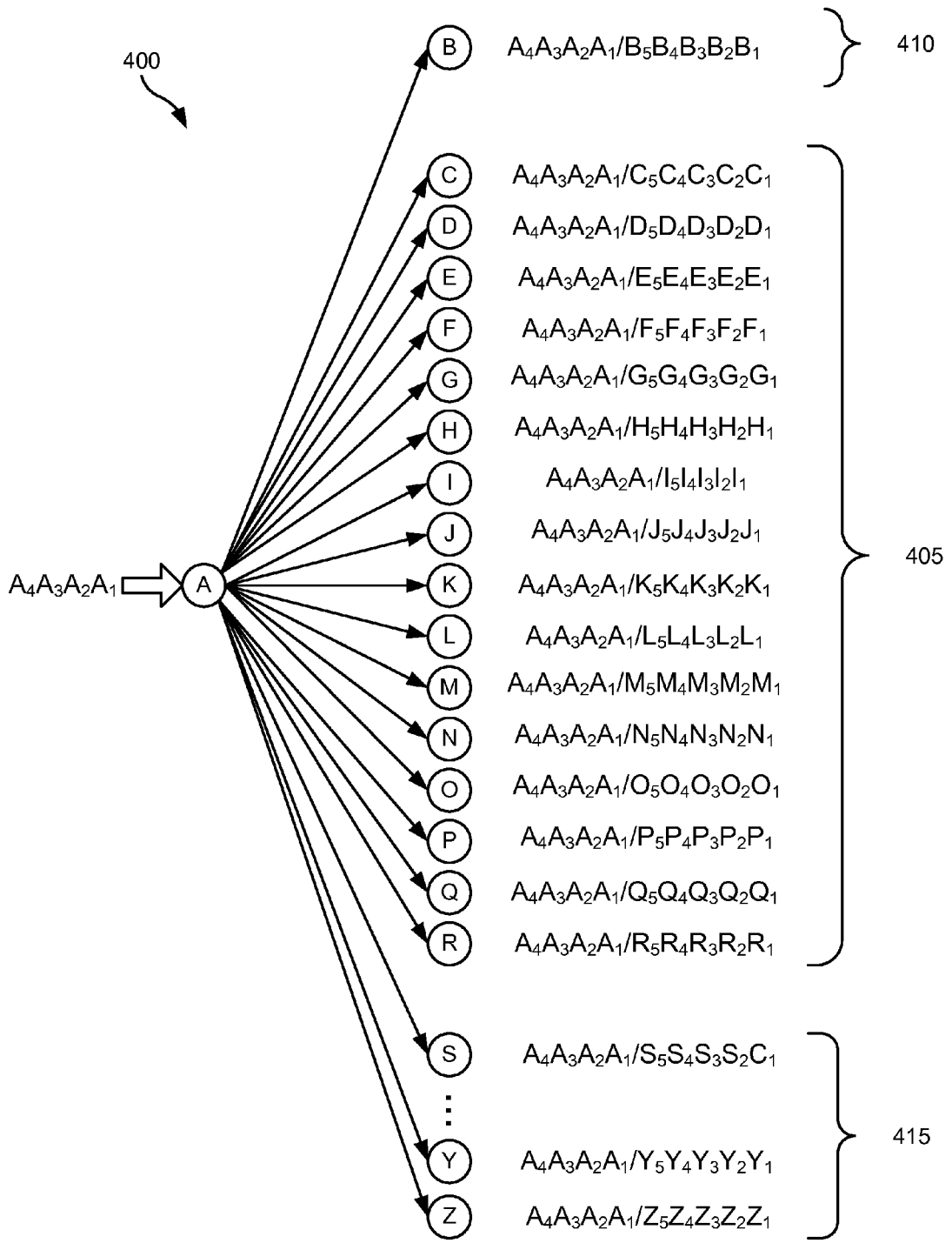
FIG. 4 shows an example encoding map that may be used in some embodiments of the present invention for implementing one run length limiting circuit of the multi-algorithm run length limiting circuitry.

Labels and colors for state pairs are selected to enforce the attributes assigned to the first run length limiting algorithm (block 315). The first run length limiting algorithm involves pairing an input state with an output state based upon a received input. When the input is received (i.e., the color) a state output (i.e., the label) from a respective paired state. The labels are lexicographically ordered with the lowest one or more (e.g., the all '0s' label) and the highest one or more (e.g., the all '1s' label) being eliminated as possible paired states. By including more paired states than are required by the number of input bits, all of the possible combinations of input bits can be represented without requiring use of the lowest and highest of the lexicographically ordered labels. Turning to FIG. 4, an example encoding map 400 is shown that pairs a four bit input to respective five bit output states in accordance with one or more embodiments of the present invention. As shown, an input state 'A' capable of receiving an input '$A_4A_3A_2A_1$' and selecting one of a number of respective states (B, C, D, E, F, G, H, I, J, K, L, M, N, O, P, Q, R, S, ... Y, Z). A transition to state B yields an output (i.e., label) '$B_5B_4B_3B_2B_1$' and occurs for a particular color or value of '$A_4A_3A_2A_1$'; a transition to state C yields an output (i.e., label) '$C_5C_4C_3C_2C_1$' and occurs for a particular color or value of '$A_4A_3A_2A_1$'; a transition to state D yields an output (i.e., label) '$D_5D_4D_3D_2D_1$' and occurs for a particular color or value of '$A_4A_3A_2A_1$'; a transition to state E yields an output (i.e., label) '$E_5E_4E_3E_2E_1$' and occurs for a particular color or value of '$A_4A_3A_2A_1$'; a transition to state F yields an output (i.e., label) '$F_5F_4F_3F_2F_1$' and occurs for a particular color or value of '$A_4A_3A_2A_1$'; a transition to state G yields an output (i.e., label) '$G_5G_4G_3G_2G_1$' and occurs for a particular color or value of '$A_4A_3A_2A_1$'; a transition to state H yields an output (i.e., label) '$H_5H_4H_3H_2H_1$' and occurs for a particular color or value of '$A_4A_3A_2A_1$'; a transition to state E yields an output (i.e., label) '$E_5E_4E_3E_2E_1$' and occurs for a particular color or value of '$A_4A_3A_2A_1$'; a transition to state F yields an output (i.e., label) '$F_5F_4F_3F_2F_1$' and occurs for a particular color or value of '$A_4A_3A_2A_1$'; a transition to state G yields an output (i.e., label) '$G_5G_4G_3G_2G_1$' and occurs for a particular color or value of '$A_4A_3A_2A_1$'; a transition to state H yields an output (i.e., label) '$H_5H_4H_3H_2H_1$' and occurs for a particular color or value of '$A_4A_3A_2A_1$'; a transition to state I yields an output (i.e., label) '$I_5I_4I_3I_2I_1$' and occurs for a particular color or value of '$A_4A_3A_2A_1$'; a transition to state J yields an output (i.e., label) '$J_5J_4J_3J_2J_1$' and occurs for a particular color or value of '$A_4A_3A_2A_1$'; a transition to state K yields an output (i.e., label) '$K_5K_4K_3K_2K_1$' and occurs for a particular color or value of '$A_4A_3A_2A_1$'; a transition to state L yields an output (i.e., label) '$L_5L_4L_3L_2L_1$' and occurs for a particular color or value of '$A_4A_3A_2A_1$'; a transition to state M yields an output (i.e., label) '$M_5M_4M_3M_2M_1$' and occurs for a particular color or value of '$A_4A_3A_2A_1$'; a transition to state N yields an output (i.e., label) '$N_5N_4N_3N_2N_1$' and occurs for a particular color or value of '$A_4A_3A_2A_1$'; a transition to state O yields an output (i.e., label) '$O_5O_4O_3O_2O_1$' and occurs for a particular color or value of '$A_4A_3A_2A_1$'; a transition to state P yields an output (i.e., label) '$P_5P_4P_3P_2P_1$' and occurs for a particular color or value of '$A_4A_3A_2A_1$'; a transition to state Q yields an output (i.e., label) '$Q_5Q_4Q_3Q_2Q_1$' and occurs for a particular color or value of '$A_4A_3A_2A_1$'; a transition to state R yields an output (i.e., label) '$R_5R_4R_3R_2R_1$' and occurs for a particular color or value of '$A_4A_3A_2A_1$'; a transition to state S yields an output (i.e., label) '$S_5S_4S_3S_2S_1$' and occurs for a particular color or value of '$A_4A_3A_2A_1$'; a transition to state T yields an output (i.e., label) '$T_5T_4T_3T_2T_1$' and occurs for a particular color or value of '$A_4A_3A_2A_1$'; and a transition to state Z yields an output (i.e., label) '$Z_5Z_4Z_3Z_2Z_1$' and occurs for a particular color or value of '$A_4A_3A_2A_1$'. The lexicographically ordered labels include mid-range values 405, low values 410, and high values 415. Low values 410 include the all '0s' label, and high values 415 include the all '1s' label. All possible instances of input '$A_4A_3A_2A_1$' are covered in mid-range 405, thus, elimination of high range 415 and low range 410 leaves all possible instances of input '$A_4A_3A_2A_1$' represented, and eliminates any output including all '1s' or all '0s'. Mid-range values 405 are selected, and both high values 415 and low values 410 are eliminated. With low range 410 and high range 415 eliminated, encoding input '$A_4A_3A_2A_1$' results in a five (5) bit output that does not include all '0s' or all '1s', and is simply decoded to yield the original written data set.

A circuit, system or software, or some combination thereof is used to implement a run length encoding algorithm applying the first run length limiting algorithm to a data input relying on the modified trellis diagram to yield an interim output, and applying the second run length limiting algorithm to the interim output relying on the selected labels and colors to yield a run length encoded output (block 340). The run length encoded output conforms to the constraints selected above in block 305.

Figure 6:
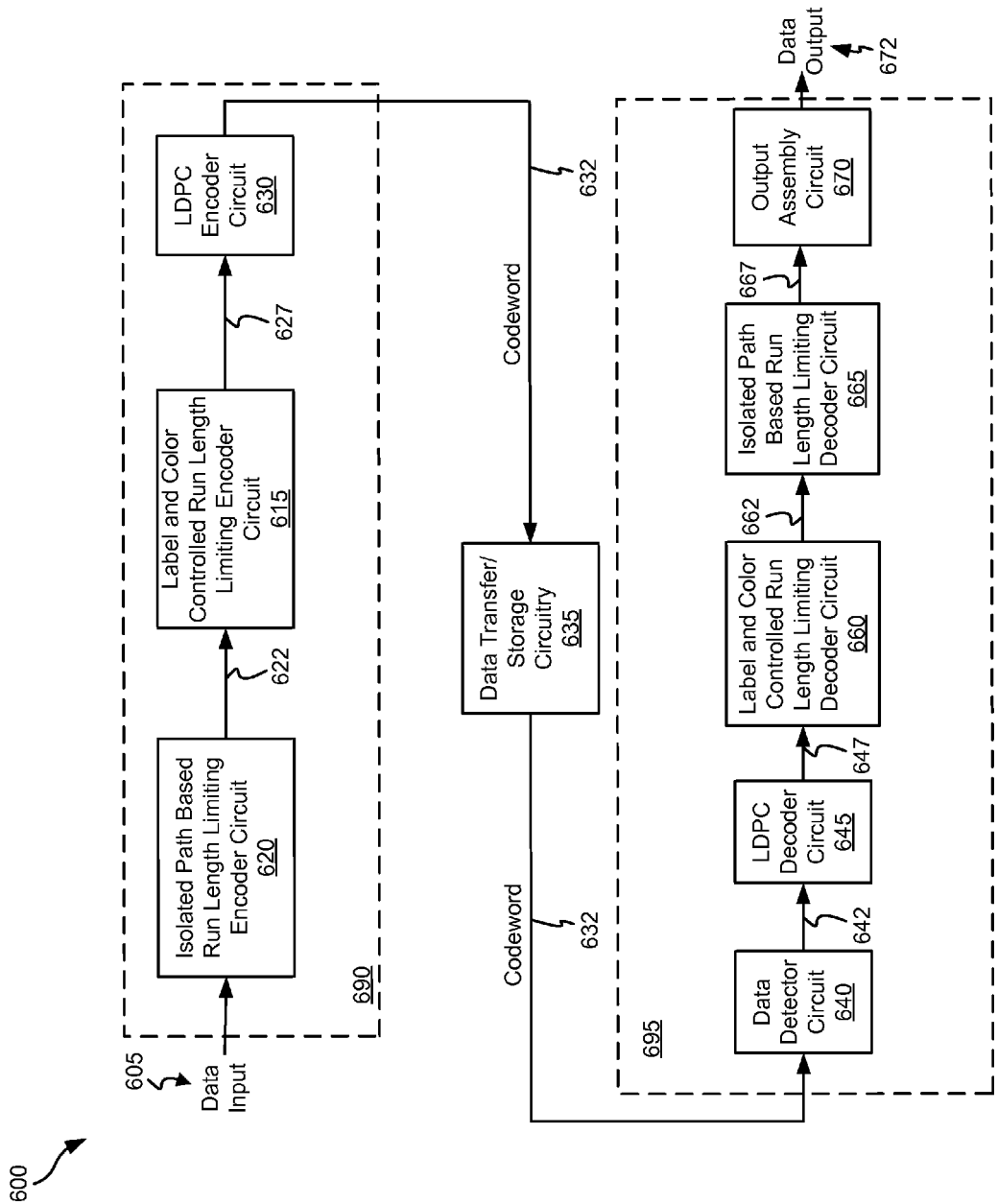
FIG. 6 shows a data processing circuit including multi-algorithm run length limiting circuitry in accordance with various embodiments of the present invention.

Turning to FIG. 6, a data processing circuit 600 including multi-algorithm run length limiting circuitry is shown in accordance with various embodiments of the present invention. Data processing circuit 600 includes a data encoding circuit 690 and a data decoding circuit 695. Data encoding circuit 690 includes an isolated path based run length limiting encoder circuit 620. Isolated path based run length limiting encoder circuit 620 implements a trellis diagram including an isolated path representing a non-transitioning output. An example of such a trellis diagram is shown in FIG. 5c where isolated path 520 represents all '0' transitions, yet precluding transition from '0' to '0' during concluding path 540. As such, isolated path based run length limiting encoder circuit 620 yields an interim level run length limited output 622 with at least one transition from a first level to a second level (i.e., a '0' to a '1', and/or a '1' to a '0') for every (2N−1) bits processed. In this case, 'N' corresponds the number of user bits encoded to yield a codeword or encoded data set.

Interim level run length limited output 622 is provided to a label and color controlled run length limiting encoder circuit 615. Label and color controlled run length limiting encoder circuit 615 implements a state map having low value and/or high value labels removed. An example of such a state map is shown in FIG. 4. Of note, the state map of FIG. 4 encodes a four bit input as a five bit output where the five it output does not include all '0s' and/or all '1s'. The state map of FIG. 4 is an example, and it should be noted that different embodiments of the present invention may be implemented using a state map that encodes an X-bit data input to a Y-bit data output, where Y is equal to or greater than X and allows for the elimination of low values (e.g., all '0s') and/or high values (e.g., all '1s'). The values of X and Y may be selected based upon various design attributes. Label and color controlled run length limiting encoder circuit 615 yields an encoded output 617. The state map is designed such that encoded output 617 includes at least one transition from a first level to a second level (i.e., a '0' to a '1', and/or a '1' to a '0') for each N bits of modulated output 617.

Modulated output 627 is provided to a low density parity check (LDPC) encoder circuit 630 that applies LDPC encoding to yield a codeword 632. In some embodiments of the present invention, LDPC encoder circuit 630 may be replaced by another type of encoder circuit. Codeword 632 is provided to some type of a data transfer or storage circuitry 635. Storage circuitry 635 may be, but is not limited to, a data write/read circuit operable to write/read data to/from a storage medium, or a circuit operable to wirelessly transfer and receive data via a wireless transfer medium. Based upon the disclosure provided herein, one of ordinary skill in the art will recognize a variety of data transfer/storage circuitry that may be used in relation to different embodiments of the present invention.

Data decoding circuit 695 includes a data detector circuit 640 that is capable of producing a detected output 642 by applying a data detection algorithm to a data input. As some examples, the data detection algorithm may be but is not limited to, a Viterbi algorithm detection algorithm or a maximum a posteriori detection algorithm as are known in the art. Based upon the disclosure provided herein, one of ordinary skill in the art will recognize a variety of data detection algorithms that may be used in relation to different embodiments of the present invention. Data detector circuit 640 may provide both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention.

Detected output 642 is provided to a LDPC decoder circuit 645 operable to apply a low density parity check decoding algorithm to detected output 642 to yield a decoded output 647. LDPC decoder circuit 645 reverses the encoding applied by LDPC encoder circuit 630. Decoded output 647 is provided to a label and color controlled run length limiting decoder circuit 660 that reverses the encoding applied by label and color controlled run length limiting encoder circuit 615 to yield an interim decoded output 662. Interim decoded output 662 is provided to an isolated path based run length limiting decoder circuit 665 that reverses the encoding applied by isolated path based run length limiting encoder circuit 620 to yield a decoded output 667. Decoded output 667 are provided to an output assembly circuit 670. Output assembly circuit 670 appends decoded output 667 to yield a data output 672.

Figure 7:
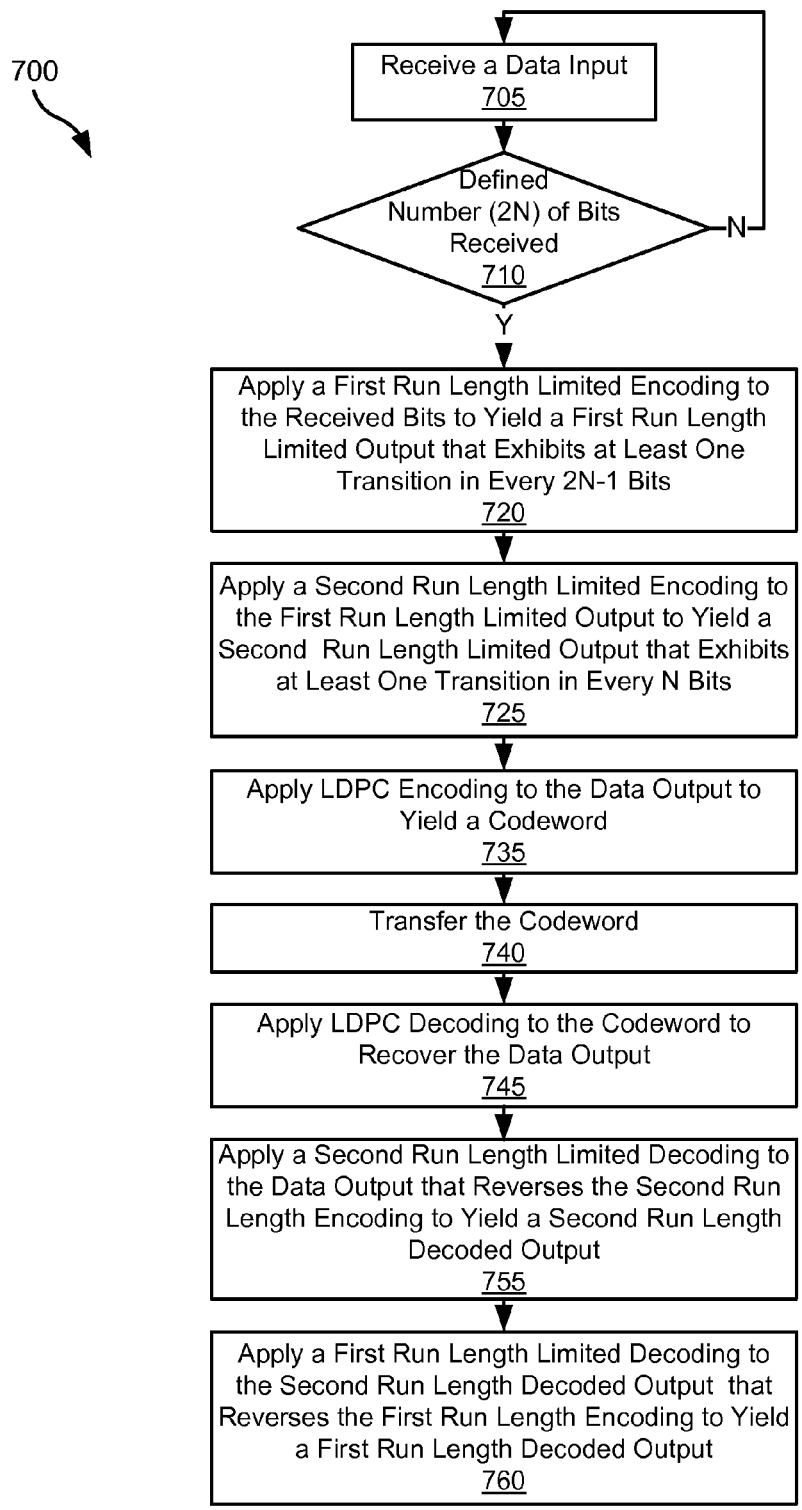
FIG. 7 is a flow diagram showing a method in accordance with some embodiments of the present invention for processing data using multi-algorithm run length limiting circuitry.

Turning to FIG. 7, a flow diagram 700 shows a method in accordance with some embodiments of the present invention for processing data using multi-algorithm run length limiting circuitry. Following flow diagram 700, a data input is received (block 705). The data input may be received, for example, serially from a data storage device or a data transmission medium. It is determined whether a defined number of bits (2N) have been received (block 710). The defined number of bits (2N) corresponds to the number of user bits that are to be encoded to generate two codewords (i.e., N bits per code codeword). Based upon the disclosure provided herein, one of ordinary skill in the art will recognize a variety of different numbers of bits that may be selected as the defined number of bits in accordance with different embodiments of the present invention.

The received bits are segregated into a first subset of a first length and a second subset of a second length (block 715). The first length plus the second length together are the defined number of bits. In some cases, the first length is the same as the second length, and in other embodiments of the present invention the first length is different than the second length.

A first run length limited encoding algorithm is applied to the received bits to yield a first run length limited output that exhibits at least one transition in every (2N−1) bits (block 720). In some embodiments of the present invention, the first run length limited encoding algorithm implements a trellis diagram including an isolated path representing a non-transitioning output. An example of such a trellis diagram is shown in FIG. 5c where isolated path 520 represents all '0' transitions, yet precluding transition from '0' to '0' during concluding path 540. The first run length limited encoding algorithm operates to assure at least one transition (i.e., a '0' to a '1', and/or a '1' to a '0') in every (2N−1) bits.

A second run length limited encoding algorithm is applied to the first run length limited output to yield a second run length limited output that exhibits at least one transition every N bits (block 725). In some embodiments of the present invention, the second run length limited encoding algorithm implements a state map having low value and/or high value labels removed. An example of such a state map is shown in FIG. 4. Of note, the state map of FIG. 4 encodes a four bit input as a five bit output where the five bit output does not include all '0s' and/or all '1s'. The state map of FIG. 4 is an example, and it should be noted that different embodiments of the present invention may be implemented using a state map that encodes an X-bit data input to a Y-bit data output, where Y is equal to or greater than X allowing for the elimination of low values (e.g., all '0s') and/or high values (e.g., all '1s'). The values of X and Y may be selected based upon various design attributes. The resulting second run length limited output includes at least one transition from a first level to a second level (i.e., a '0' to a '1', and/or a '1' to a '0').

LDPC encoding is then applied to the data output to yield a codeword (block 735). The codeword is transferred (block 740). The codeword may be transferred, for example, by writing a representation of the codeword to a storage medium and later reading the representation of the codeword from the storage medium. As another example, the codeword may be transferred by transmitting a representation of the codeword to a receiver. Based upon the disclosure provided herein, one of ordinary skill in the art will recognize a variety of mechanisms that may be used in relation to different embodiments of the present invention to transfer the codeword.

LDPC decoding is applied to the codeword to recover the data output (block 745). A second run length decoding algorithm that reverses the second run length encoding algorithm from block 725 is applied to the data output to yield a second run length decoded output (block 755). A first run length decoding algorithm that reverses the first run length encoding algorithm from block 720 is applied to the second run length decoded output to yield a first run length decoded output (block 760). When the decoding is correctly performed, the first run length decoded outputs corresponding to two consecutive transferred codewords corresponds to the bits received in block 710.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for out of order data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
a data modulation circuit operable to:
receive a data input;

apply a first run length limiting algorithm to the data input to yield a first interim run length limited output of a block length N and a second interim run length limited output of a block length N, wherein the combination of the first interim run length limited output and the second run length limited output exhibits at least one transition from a first level to a second level; and apply a second run length limiting algorithm to the first interim run length limited output to yield a modulated output, wherein the modulated output exhibits at least one transition between the first level and the second level.

2. The data processing system of claim 1, wherein the first run length limiting algorithm operates to assure a transition at the last bit in the second interim run length limited output from the first level to the second level where at least a defined number of preceding bits in the data input are at the first level.

3. The data processing system of claim 2, wherein the defined number is less than N.

4. The data processing system of claim 3, wherein the defined number is less than one half of N.

5. The data processing system of claim 1, wherein the maximum number of consecutive non-transitioning states across the combination of the first interim run length limited output and the second interim run length limited output is (2N−1).

6. The data processing system of claim 1, wherein the second run length limiting algorithm is an encoding algorithm that replaces each pattern in the first interim run length limited output corresponding to one of a set of first defined data patterns with a corresponding pattern from a set of second defined data patterns, wherein every pattern in the set of second defined patterns includes at least one transition between the first level and the second level.

7. The data processing system of claim 1, wherein the combination of the first level and the second level is selected from a group consisting of: a logic '1' and a logic '0', respectively; and a logic '0' and a logic '1', respectively.

8. The data processing system of claim 1, wherein the data processing system further comprises:
a low density parity check encoder circuit operable to encode the modulated output to yield a codeword.

9. The data processing system of claim 8, wherein the system further comprises:
a data processing circuit, wherein the data processing circuit is operable to:
apply a first decoding algorithm to reverse the encoding by the low density parity check encoder circuit; and
apply a second decoding algorithm to reverse the encoding applied by the data modulation circuit.

10. The data processing system of claim 9, wherein the data processing circuit comprises:
a low density parity check decoder circuit; and
a data detection circuit, wherein the data detection circuit is selected from a group consisting of: a maximum a posteriori data detector circuit, and a Viterbi algorithm data detector circuit.

11. The data processing system of claim 1, wherein the system is implemented as an integrated circuit.

12. The data processing system of claim 1, wherein the system is implemented as part of a device selected from a group consisting of: a communication device, and a storage device.

13. A method for data processing, the method comprising:
receiving a data input;
applying a first run length limiting algorithm to the data input to yield a first interim run length limited output of a block length N and a second interim run length limited output of a block length N, wherein the combination of the first interim run length limited output and the second run length limited output exhibits at least one transition from a first level to a second level; and
applying a second run length limiting algorithm to the first interim run length limited output to yield a modulated output, wherein the modulated output exhibits at least one transition between the first level and the second level.

14. The method of claim 13, wherein the first run length limiting algorithm is based at least in part on: an input split trellis yielding an isolated path, and eliminating a final stage of the isolated path.

15. The method of claim 14, wherein the first run length limiting algorithm operates to assure a transition at the last bit in the second interim run length limited output from the first level to the second level where at least a defined number of preceding bits in the data input are at the first level.

16. The method of claim 15, wherein the defined number is less than N.

17. The method of claim 15, wherein the maximum number of consecutive non-transitioning states across the combination of the first interim run length limited output and the second interim run length limited output is (2N−1).

18. The method of claim 13, wherein the second run length limiting algorithm is based at least in part on pre-defined relationships between each of a number of labels in a set of labels and a respective color in a set of colors, wherein every color in the set of colors includes at least one transition between the first level and the second level.

19. The method of claim 13, wherein the combination of the first level and the second level is selected from a group consisting of: a logic '1' and a logic '0', respectively; and a logic '0' and a logic '1', respectively.

20. A storage device, the storage device comprising:
a storage medium;
a head assembly disposed in relation to the storage medium and operable to provide a sensed signal corresponding to a data set on the storage medium, and to store a write data to the storage medium; and
a read channel circuit including:
a data modulation circuit operable to:
receive a data input;
apply a first run length limiting algorithm to the data input to yield a first interim run length limited output of a block length N and a second interim run length limited output of a block length N, wherein the combination of the first interim run length limited output and the second run length limited output exhibits at least one transition from a first level to a second level; and
apply a second run length limiting algorithm to the first interim run length limited output to yield a modulated output, wherein the modulated output exhibits at least one transition between the first level and the second level; and
wherein the write data is derived from the modulated output.

* * * * *